United States Patent [19]
Sahara

[11] Patent Number: 5,404,099
[45] Date of Patent: Apr. 4, 1995

[54] SEMICONDUCTOR DEVICE

[75] Inventor: Hiroshi Sahara, Yokohama, Japan

[73] Assignee: Kabushiki Kaisha Toshiba, Kawasaki, Japan

[21] Appl. No.: 37,071

[22] Filed: Mar. 25, 1993

[30] Foreign Application Priority Data

Apr. 8, 1992 [JP] Japan .................................. 4-086962

[51] Int. Cl.⁶ .................................. G01R 31/28
[52] U.S. Cl. .................................. 324/158.1; 324/73.1; 371/21.1
[58] Field of Search ..................... 324/158.1, 73.1, 771; 365/201; 371/21.1, 21.4

[56] References Cited

U.S. PATENT DOCUMENTS 4,818,981 4/1989 Oki et al. ........................... 371/21.1
4,970,454 11/1990 Stambaugh et al. ................ 324/73.1
5,012,185 4/1991 Ohfuji ................................. 324/158.1
5,097,206 3/1992 Perner ................................. 324/73.1

Primary Examiner—Ernest F. Karlsen
Attorney, Agent, or Firm—Banner, Birch, McKie & Beckett

[57] ABSTRACT

A semiconductor device comprises a plurality of circuits formed on an IC chip area, having electric power systems each being independent, a plurality of power potential supply wires connected to the plurality of circuits, respectively, a plurality of power potential supply terminals connected to the plurality of power potential supply wires, respectively, at least one pad for voltage stress test formed on the IC chip area, and controllers for controlling a predetermined voltage stress to be applied from one of the plurality of power potential supply terminals to all power potential supply wires on the IC chip area by use of an input from the pad for voltage stress test.

10 Claims, 8 Drawing Sheets

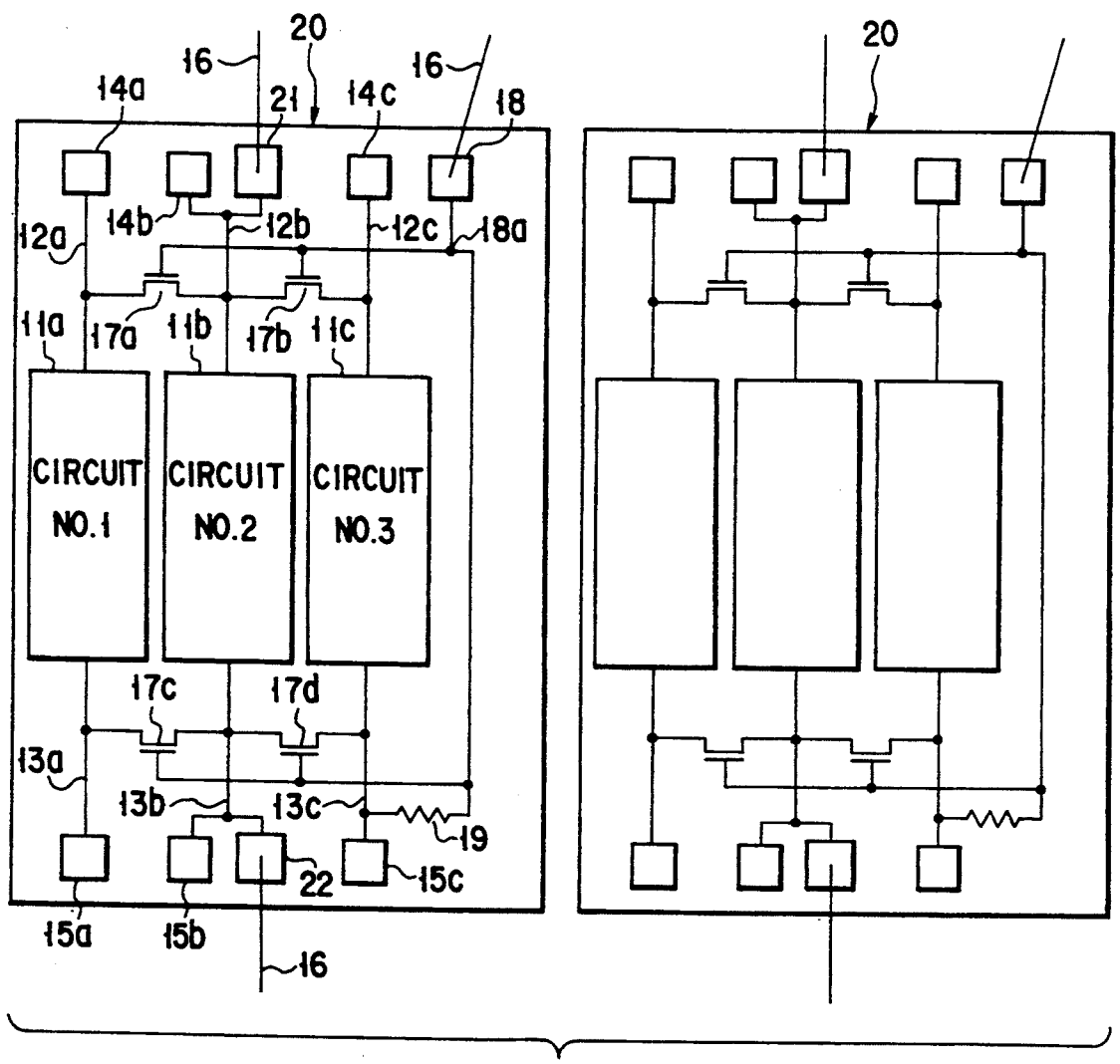
F I G. 4

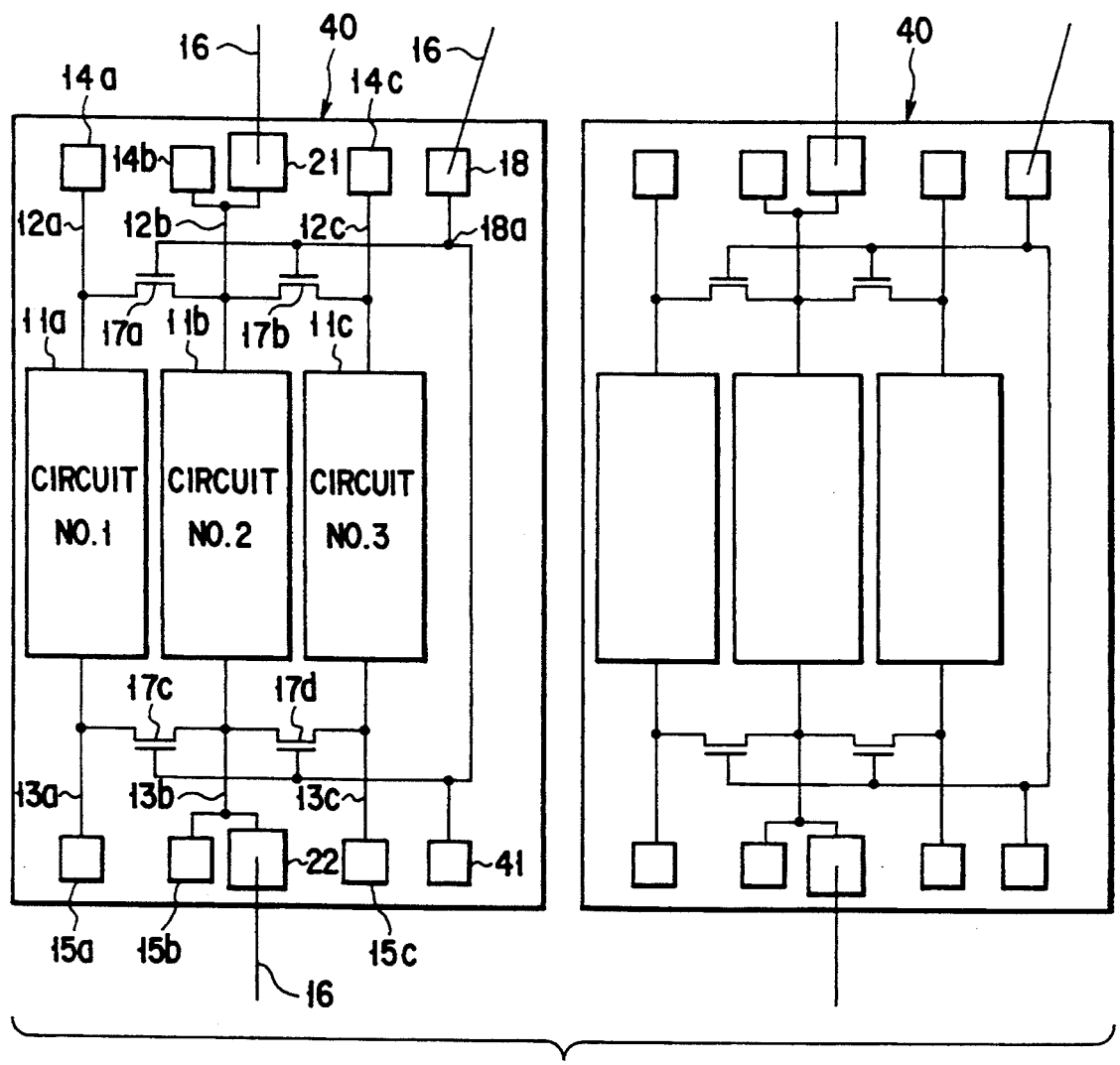
F I G. 6

SEMICONDUCTOR DEVICE

BACKGROUND OF THE INVENTION

1. Field of the Invention

The present invention relates to a semiconductor device and more particularly to a semiconductor device having pads for a voltage stress test suitable for performing screening of defective chip areas by use of a probe card and prober in a wafer state.

2. Description of the Related Art

In a manufacturing process of a semiconductor device, after a wafer manufacturing process is finished, good chip areas are selected by a diesort test and defective chip areas are marked. Thereafter, good chip areas are contained in a package, and the shape of the final product is finished. Then, the semiconductor whose shape is finished as a final product and whose package is finished is burned-in.

In contrast, for performing screening of the defective chip areas by use of a probe card and a prober when the chip areas are in a wafer state before the diesort test, the following process is an ideal in view of the efficiency of the voltage stress test.

The needles of the probe card are simultaneously brought into contact with pads for a voltage stress test to be used in performing the screening of the defective goods on all IC chip areas on the wafer, and a voltage stress is applied thereto. In the above explanation, the terminals on the wafer are called as pads, and the terminals of the probe card are called as needles. However, any members may be used if they are structured to be electrically connected to each other.

However, in the present state of the probe card technique, it is impossible to simultaneously bring the needles of the probe card into contact with all chip areas on the wafer. In actual, it is preferable that the needles of the probe card be simultaneously brought into contact with the pads for voltage stress test on the chip areas on the wafer as much as possible. Therefore, it is preferable that the number of needles to be brought into contact with one chip area be the smallest as possible.

The following explains a case in which the voltage stress is applied to the chip areas by use of a power potential supply wire and a ground potential supply wire.

FIGS. 1 and 2 show a state that the needles of the probe card are brought into contact with two chip areas adjacent to each other among a plurality of IC chip areas on the wafer and the voltage stress is applied thereto when the conventional semiconductor device is burned-in in a wafer state.

In FIG. 1, three circuits 71a to 71c each having an independent electric power system are formed on each chip area 70. There are independently formed three VCC lines (power potential VCC supply wires) 72a to 72c to correspond to these circuits and three VSS lines (ground potential VSS supply wires) 73a to 73c. Three VCC pads 74a to 74c are formed to correspond to three VCC lines 72a to 72c, and three VSS pads 75a to 75c are formed to correspond to three VSS lines 73a to 73c.

The pads 74a to 74c and 75a to 75c are used such that the needles 76 projected from two sides of the probe card facing each other are simultaneously brought into contact with these pads and the voltage stress is applied the chip areas in a case that screening of the defective chip areas is performed by use of the probe card and the prober when the chip areas are in a wafer state before the diesort test.

Also, the pads 74a to 74c and 75a to 75c are used such that the needles 76 of the probe card are brought into contact with these pads at the time of the diesort test.

Moreover, the pads 74a to 74c and 75a to 75c are used such that these pads are bonded to outer pins (not shown) by a bonding wire when chips are separated from the semiconductor device in a wafer state and the respective separated chips are contained in the package.

For applying the voltage stress to the circuits 71a to 71c formed on the chip area 70 having three electric power systems by use of VCC lines 72a to 72c and VSS lines 73a to 73c in the wafer state, the necessary number of needles 76 of the probe card is six since the needles 76 must be simultaneously brought into contact with all pads, that is, VCC pads 74a to 74c and VSS pads 75a to 75c.

In a case that the circuit group having only one electric power system is formed on the chip area, since one VCC line and one VSS line, which are connected to the circuit group and one VCC pad and one VSS pad are provided, the number of the needles 76 may be two when applying the voltage stress in the wafer state.

Therefore, the necessary number of needles 76 of the former chip areas increases three times as many as that of the latter chip areas, so that the number of the chip areas with which the needles 76 can be brought into contact reduces to ⅓. In other words, the needles 76 of the probe cannot be brought into contact with all chip areas on the wafer due to the technical limitation of the number of the needles in the present technical state. Therefore, the efficiency of the voltage stress test to be applied to the wafer where the former chip area 70 is formed is reduced to ⅓ as compared with the wafer where the latter chip area is formed.

The efficiency of the voltage stress test is reduced as the number of the VCC lines 72a to 72c and that of VSS lines 73a to 73c and the number of the corresponding VCC pads 74a to 74c and that of VSS pads 75a to 75c are increased.

The following will explain some cases in which a plurality of VCC pads or VSS pads are formed on one chip area.

(A) In an IC chip contained in the package having one VCC pin or VSS pin, the electric power system are separated from the circuit group each being independent in the chip, the VCC pads or VSS pads are formed in each circuit, and bonded to one VCC pin or one VSS pin in a multiple fashion;

(B1) In an IC chip contained in the package having a plurality of VCC pins or VSS pins, the electric power system are separated from the circuit group each being independent in the chip, the VCC pads or VSS pads are formed in each circuit, the number of the VCC pads or VSS pads is larger than that of the VCC pins or VSS pins, and the VCC pads or VSS pads are bonded to an arbitrarily VCC pin or VSS pin in a multiple fashion;

(B2) In an IC chip contained in the package having a plurality of VCC pins or VSS pins, the electric power system are separated from the circuit group each being independent in the chip, the VCC pads or VSS pads are formed in each circuit, the number of the VCC pads or VSS pads is the same as that of the VCC pins or VSS pins, bonding pads are formed on the plurality of VCC lines or VSS lines, respectively, and bonded to the VCC pads or VSS pads, respectively.

(B3) In an IC chip contained in the package having a plurality of VCC pins or VSS pins, the electric power system are not separated, a plurality of bonding pads are formed on the VCC lines or VSS lines, respectively and bonded to the VCC pins or VSS pins, respectively, so as to lower the resistance of VCC lines or that of VSS lines.

Among the above cases (A) to (B3), in cases (A), (B1), and (B2), since the needles of the probe card must be in contact with the chip area by the number of VCC pads or VSS pads formed on the chip area, the efficiency of the voltage stress test is reduced.

On the other hand, in a chip area 80 shown in FIG. 2, pads 81a to 81c for stress test are formed separately from VCC pads 74a to 74c for bonding so as to correspond to the VCC lines 72a to 72c. Similarly, pads 82a to 82c for stress test are formed separately from VSS pads 75a to 75c for bonding so as to correspond to the VSS lines 73a to 73c.

As shown in FIG. 2, in the case that six pads 81a to 81c and 82a to 82c for voltage stress test are formed separately from the pads for bonding, the chip area will be increased by the number of six pads for voltage stress test.

SUMMARY OF THE INVENTION

In the conventional semiconductor device in which a plurality of circuits having electric power systems each being independent are formed on an IC chip, the number of pads for voltage stress test per one chip is increased when contact needles of a probe card are brought into contact with pads for voltage stress test on the chip area formed on the wafer and voltage stress is applied thereto in order to perform a screening test of defective chip area in a wafer state.

An object of the present invention is to provide a semiconductor device which can solve the above problem.

In order to attain the above object, the present invention provides a semiconductor device comprising a plurality of circuits formed on an IC chip area, having electric power systems each being independent, a plurality of power potential supply wires connected to the plurality of circuits, respectively, a plurality of power potential supply terminals connected to the plurality of power potential supply wires, respectively, at least one pad for voltage stress test formed on the IC chip area, and a controller for controlling voltage stress to be applied from one of the plurality of power potential supply terminals to all power potential supply wires on the IC chip area by use of an input from the pad for voltage stress test.

According to the semiconductor device of the present invention, the contact needles of the probe card are simultaneously brought into contact with one pad of the plurality of power potential supply pads when screening defective the chip area in the wafer state, thereby making it possible to apply a predetermined voltage stress to all power potential supply wires on the IC chip area by use of the input from the pad for voltage stress test.

Therefore, it is unnecessary to provide a plurality of pads for voltage stress test to correspond to all power potential supply wires on the IC chip.

In other words, it is possible to reduce the number of pads, which the needles of the probe card contact, for voltage stress test per one chip when screening defective the chip area in the wafer state. At the same time, the number of chips to which voltage stress can be applied is increased, the efficiency of screening of the defective chip area can be improved, the ability of production can be improved, screening time of the defective chip area can be shortened, so that manufacturing cost can be reduced.

Moreover, in a case that the pads for voltage stress test are formed separately from the pads for bonding formed on the IC chip area, the number of the pads for voltage stress test can be reduced, and the increase in the chip area can be controlled.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 4 is a plane view showing a state that needles of a prober card are brought into contact with a chip area and voltage stress is applied thereto when a semiconductor device according to a second embodiment of the present invention is burned-in in a wafer state;

FIG. 6 is a plane view showing a state that needles of a prober card are brought into contact with a chip area and voltage stress is applied thereto when a semiconductor device according to a fourth embodiment of the present invention is burned-in in a wafer state;

DETAILED DESCRIPTION OF THE PREFERRED EMBODIMENTS

Figure 1:
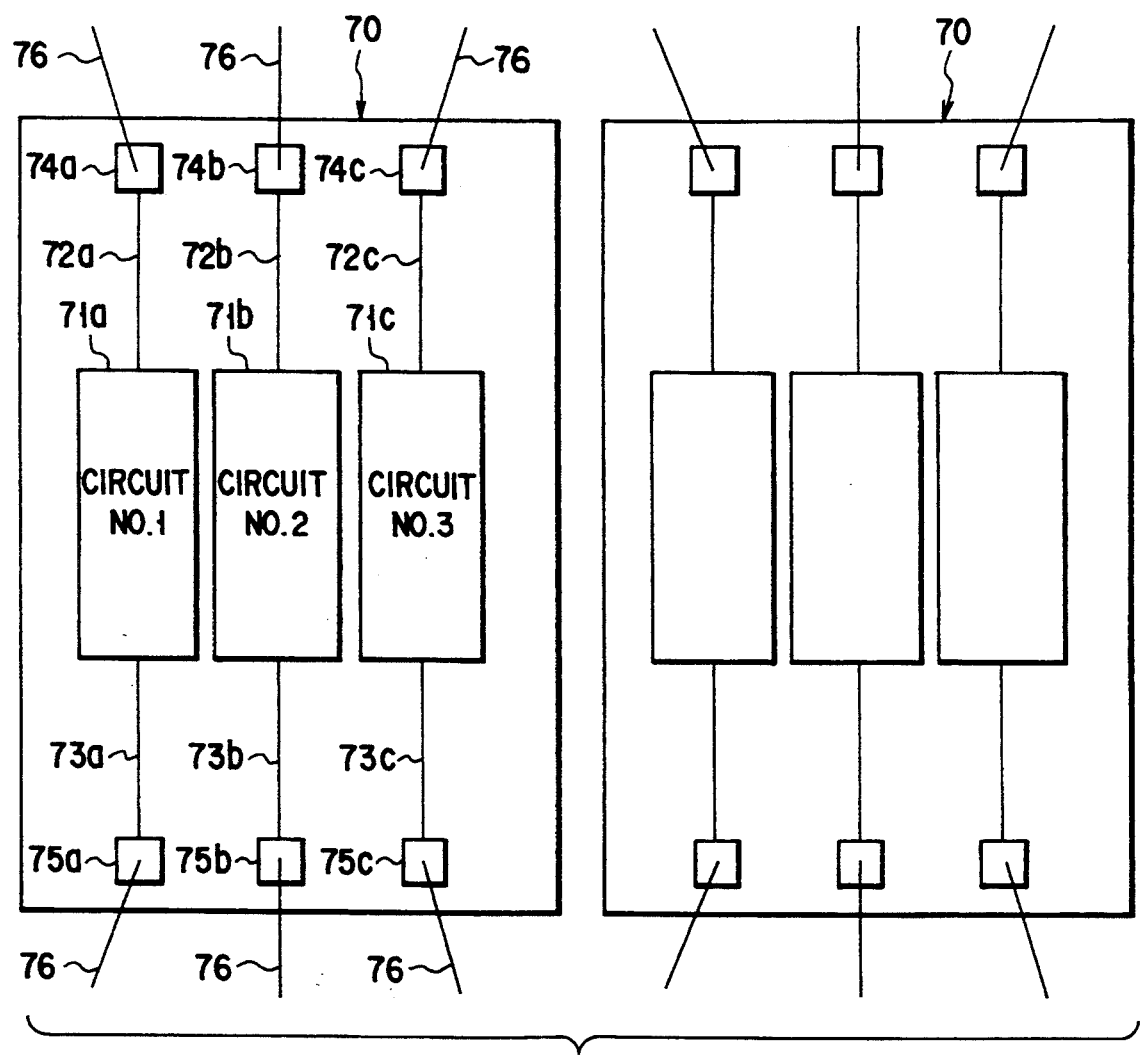
FIG. 1 is a plane view showing a state that needles of a prober card are brought into contact with a chip area and voltage stress is applied thereto when a conventional semiconductor is burned-in in a wafer state.

Embodiments of the present invention will be explained with reference to the drawings.

In the explanation, the same reference numerals are used in the common portion through the whole drawings to avoid the same explanation.

Figure 3:
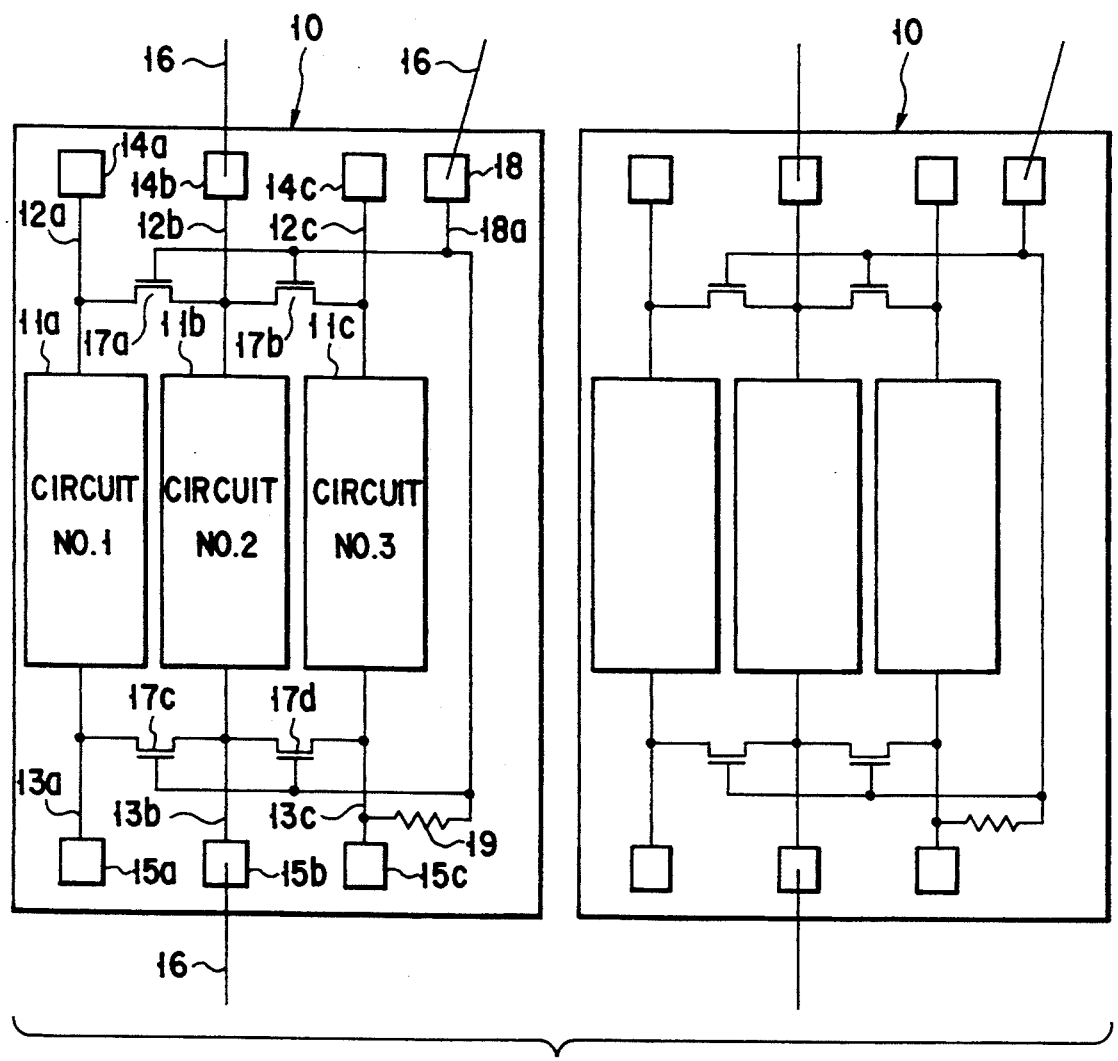
FIG. 3 is a plane view showing a state that needles of a prober card are brought into contact with a chip area and voltage stress is applied thereto when a semiconductor device according to a first embodiment of the present invention is burned-in in a wafer state.

FIG. 3 shows a plane view showing a state that the needles of a probe card are simultaneously brought into contact with two adjacent chip areas and voltage stress is applied thereto when a semiconductor device relating to a first embodiment of the present invention is burned-in in a wafer state.

In FIG. 3, reference numeral 10 is a plurality of chip areas formed on a semiconductor wafer. Three circuits 11a to 11c each having an independent electric power system are formed on each chip area. Three power potential supply wires (VCC lines) 12a to 12c and three ground potential supply wires (VSS) 13a to 13c are independently formed in order to correspond to these circuits.

Three VCC pads 14a to 14c are formed in order to correspond the above three VCC lines 12a to 12c, and three VSS pads 15a to 15c are formed in order to correspond to the above three VSS lines 13a to 13c.

Moreover, on each chip area, there are formed one pad 18 for voltage stress test and a controller for applying voltage stress from one of three VCC pads 14a to 14c to all VCC lines 12a to 12c and from one of three VSS pads 15a to 15c to all VSS lines 13a to 13c by use of input from the pad 18 for stress test.

As one specific example of the above controller, there is formed a controller having an NMOS transistor 17a for selectively connecting two adjacent VCC lines 12a and 12b among the above three VCC lines 12a to 12c, an NMOS transistor 17b for selectively connecting two adjacent VCC lines 12b and 12c among the above three VCC lines 12a to 12c, an NMOS transistor 17c for selectively shortcircuiting two adjacent VSS lines 13a and 13b among the above three VCC lines 13a to 13c, and an NMOS transistor 17d for selectively shortcircuiting two adjacent VSS lines 13b and 13c among the above three VCC lines 13a to 13c.

Gates of the transistors 17a to 17d are connected in common and a common connection node 18a is connected to the pad 18 and one VSS line (for example, 13c) through a resistor 19.

The following will explain the voltage application to each pad at the time of a voltage stress test and a diesort test of the semiconductor device in the wafer state, and an operation of the normal use of the semiconductor device, which is separated into individual chips from the device in a wafer state and contained in the package to be finished.

When screening of the defective chip area is performed by use of the probe card and the prober before a diesort test in a wafer state of the semiconductor, a needle 16 projecting from the probe card is brought into contact with the pad 18 for stress test and a gate voltage is applied thereto such that the transistors 17a to 17d are turned on. If the respective transistors 17a to 17d are turned on, three VCC lines 12a to 12c are shortcircuited each other, and three VSS lines 13a to 13c are shortcircuited each other.

Therefore, the supply of VCC potential may be performed by bringing the needle 16 of the probe card into contact with one of three VCC pads 14a to 14c (e.g, 14b). Similarly, the supply of VSS potential may be performed by bringing the needle 16 of the probe card into contact with one of three VSS pads 15a to 15c (e.g, 15b).

Since the pad 18 for stress test (gate voltage applying pad) is connected to the VSS line 13c through the resistor 19, a current flows into the VSS line from the pad 18 for stress test through the resistor 19. It is necessary to set the value of the resistor 19 to be extremely high such that the level of current is kept low.

Similarly, at the time of the diesort test, the needles 16 of the probe card are brought into contact with all VCC pad 14a to 14c and VSS pads 15a to 15c, three circuits 11a to 11c each having an independent power system are tested, good chip areas are selected. At the time of the diesort test, the common connection node 18a is pulled-down to VSS potential by the resistor 19. Due to this, the respective transistors 17a to 17d are turned off, three VCC lines 12a to 12c are independently separated from each other, and three VSS lines 13a to 13c are independently separated from each other. Moreover, in the case that the semiconductor device in a wafer state is separated into individual chips and contained in the package, three VCC pads 14a to 14c and three VSS pads 15a to 15c are respectively connected to an outer pin (not shown) by a wire bonding.

When the semiconductor device, is contained in the package and finished, is normally used, the common connection node 18a is pulled-down to VSS potential by the resistor 19. Due to this, the respective transistors 17a to 17d are turned off, three VCC lines 12a to 12c are independently separated from each other, and three VSS lines 13a to 13c are independently separated from each other.

According to the semiconductor device of FIG. 3, there are provided transistors (17a, 17b) for selectively shortcircuiting three VCC lines 12a to 12c formed to correspond to three circuits 11a to 11c each having an independent power system, transistors (17c, 17d) for selectively shortcircuiting three VSS lines 13ato 13c, and the pad for stress test 18 connected to the gates of the transistors 17a to 17d in common.

Therefore, the voltage can be applied to the pad 18 such that the respective transistors 17a to 17d are turned on only when the voltage stress test is performed in the wafer state of the semiconductor. Also, the number of the needles 16 of the probe card, which are necessary to perform the voltage stress test, can be reduced.

In other words, in the structure shown in FIG. 3, the number of the needles of the probe card necessary for one chip may three as compared with six needles of the probe card in the structure of the prior art shown in FIG. 1.

Therefore, if the structure of FIG. 3 is used in a case that the number of the needles of the probe card is technically limited, the number of the chip areas, to which the voltage stress is simultaneously applied, is doubled, and the efficiency of the voltage stress test can be improved twice as much as the prior art.

FIG. 4 is a plane view showing a state that the needles of a probe card are simultaneously brought into contact with chip areas and voltage stress is applied thereto when a semiconductor device relating to a second embodiment of the present invention is burned-in in a wafer state.

In FIG. 4, each chip area 20 is the same as each chip area 10 of FIG. 3 excepting the following points:

The VCC pad 14b corresponding to one VCC line (e.g., 12b) and a pad 21 for stress test are individually formed, and the VSS pad 15b corresponding to one VSS line (e.g., 13b) and a pad 22 for stress test are individually formed.

According to the semiconductor device of FIG. 4, the same technical advantage can be obtained, and the following technical advantage can be further obtained.

That is, if the pad is damaged by the contact of the needles of the probe card at the time of the voltage stress test, there occurs a problem when a diesort test and a wire bonding are performed in a latter process. In order to avoid such a problem, the pad for the voltage stress test and the boding pad are individually formed.

Figure 2:
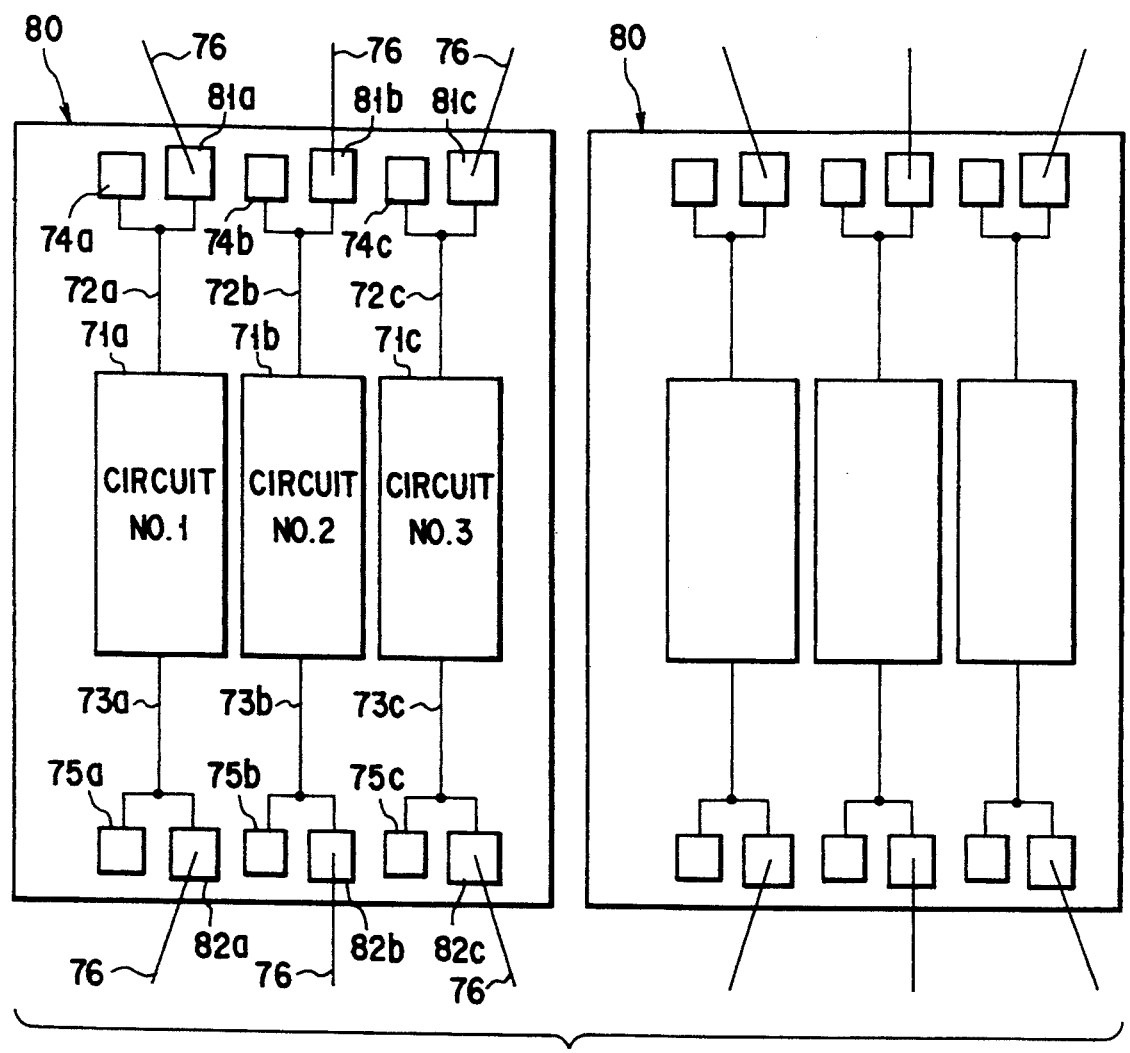
FIG. 2 is a plane view showing a state that needles of a prober card are brought into contact with a chip area and voltage stress is applied thereto when another conventional semiconductor is burned-in in a wafer state.

In the prior art of FIG. 2, it was necessary to add six pads for stress test, that is, pads 81a to 81c and 82a to 82c, to correspond to three VCC lines and three VSS lines separately from the bonding pad.

In contrast, in the structure of FIG. 4, only three pads, that is, pads 21 and 22 for stress test, which respectively correspond to VCC line 12b and VSS line 13b, and pad 18 for gate voltage application, may be added. Therefore, since the number of pads to be added is small, increase in the chip area can be restrained.

The technical advantages mentioned in the above embodiments (FIGS. 3 and 4) becomes remarkable as the number of circuits each having independent electric power system on the chip area is increased more.

In other words, in the structure of FIG. 1 or FIG. 2, the number of VCC pads and VSS pads were increased by the increase in the number of circuits 71a to 71c, and the number of the needles of the probe card necessary for one chip was increased when screening of detective chip area in the wafer state was performed.

In contrast, according to the structure of FIG. 3 or FIG. 4, even if the number of circuits 11a to 11c is increased, there may be formed a transistor for selectively shortcircuiting the portion between VCC lines and a transistor for selectively shortcircuiting the portion between VSS lines. Therefore, it is unnecessary to increase the number of pads 18 for stress test, and the number of the needles of the probe card necessary for one chip may be small when screening of detective chip area in the wafer state is performed.

Figure 5:
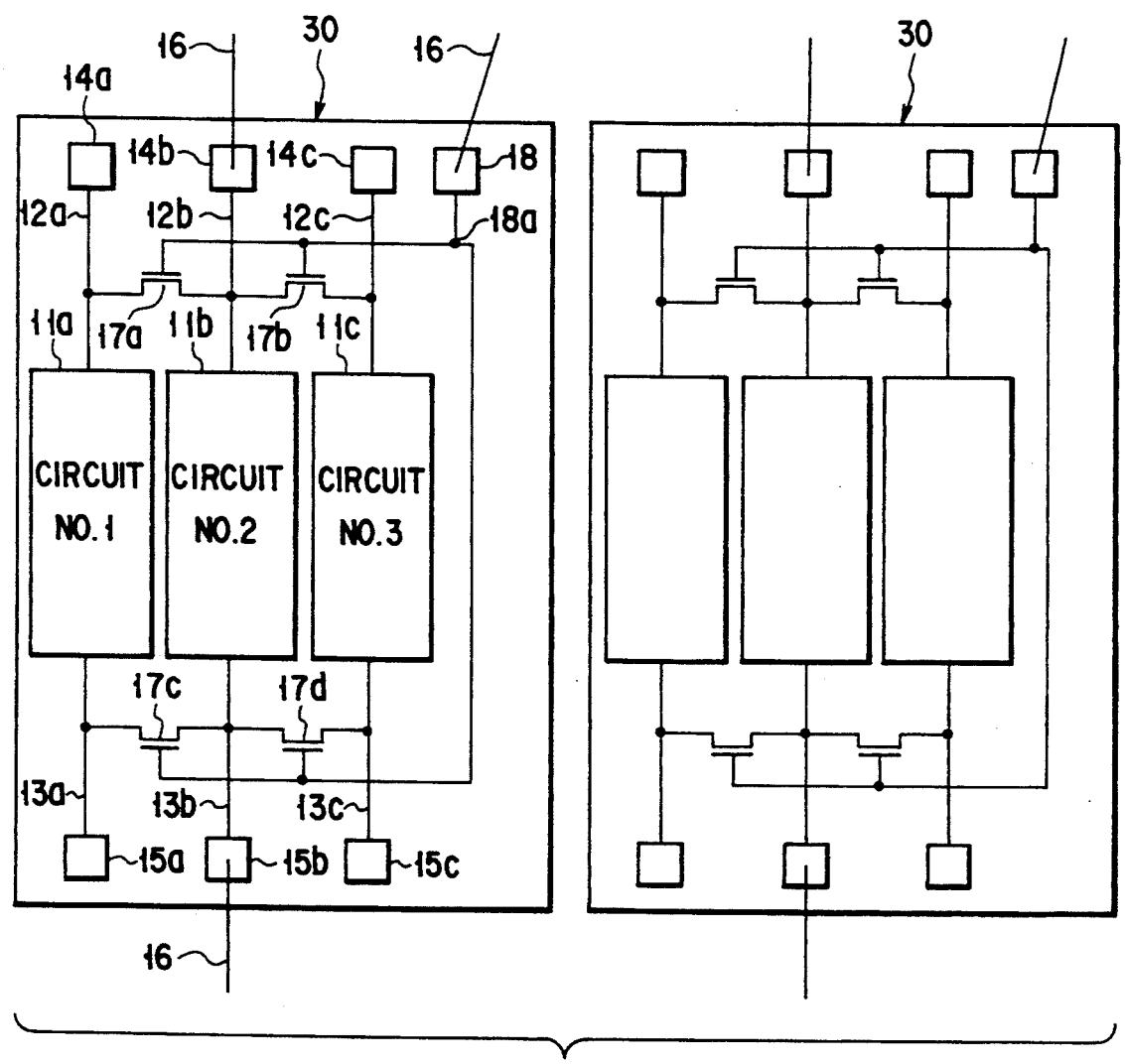
FIG. 5 is a plane view showing a state that needles of a prober card are brought into contact with a chip area and voltage stress is applied thereto when a semiconductor device according to a third embodiment of the present invention is burned-in in a wafer state.

FIG. 5 is a plane view showing a state that the needles of a probe card are brought into contact with chip areas and voltage stress is applied thereto when a semiconductor device relating to a third embodiment of the present invention is burned-in in a wafer state.

In FIG. 5, each chip area 30 is the same as each chip area 10 of FIG. 3 excepting that the resistor 19 is omitted as compared with the chip 10 of FIG. 3.

According to the semiconductor device of FIG. 5, basically the same operation and technical advantage as those of the semiconductor device of FIG. 3 can be obtained. However, the following point is different from the semiconductor device of FIG. 3.

More specifically, since the resistor 19 is omitted, the following points are required.

At the time of diesort test, the needle 16 of the probe card is brought into contact with the pad 18 for gate voltage application and VSS potential is supplied thereto, thereby each of the transistors 17a to 17d is turned off. At the time of containing the semiconductor device in the package, the pad 18 for gate voltage application is bonded to the VSS pin (not shown) by the wire bonding, thereby each of the transistors 17a to 17d is turned off.

FIG. 6 is a plane view showing a state that the needles of a probe card are brought into contact with chip areas and voltage stress is applied thereto when a semiconductor device relating to a fourth embodiment of the present invention is burned-in in a wafer state.

In FIG. 6, each chip area 40 is the same as each chip area 20 of FIG. 4 excepting that the resistor 19 is omitted and that a bonding pad 41 corresponding to the common connection node 18a is added separately from the pad 18 for gate voltage application.

According to the semiconductor device of FIG. 6, basically the same operation and technical advantage as those of the semiconductor device of FIG. 4 can be obtained. However, the following point is different from the semiconductor device of FIG. 4.

That is, at the time of diesort test, the needle 16 of the probe card is brought into contact with the bonding pad 41 and VSS potential is supplied thereto, thereby each of the transistors 17a to 17d can be turned off. At the time of containing the semiconductor device in the package, the bonding pad 41 bonded to the VSS pin (not shown) by the wire bonding, thereby each of the transistors 17a to 17d can be turned off.

In FIG. 6, there was explained the case that the needle 16 of the probe card is brought into contact with the bonding pad 41 and VSS potential is supplied thereto, thereby each of the transistors 17a to 17d can be turned off. However, it is possible to set the transistors 17a to 17d to be turned off by different means.

Figure 7:
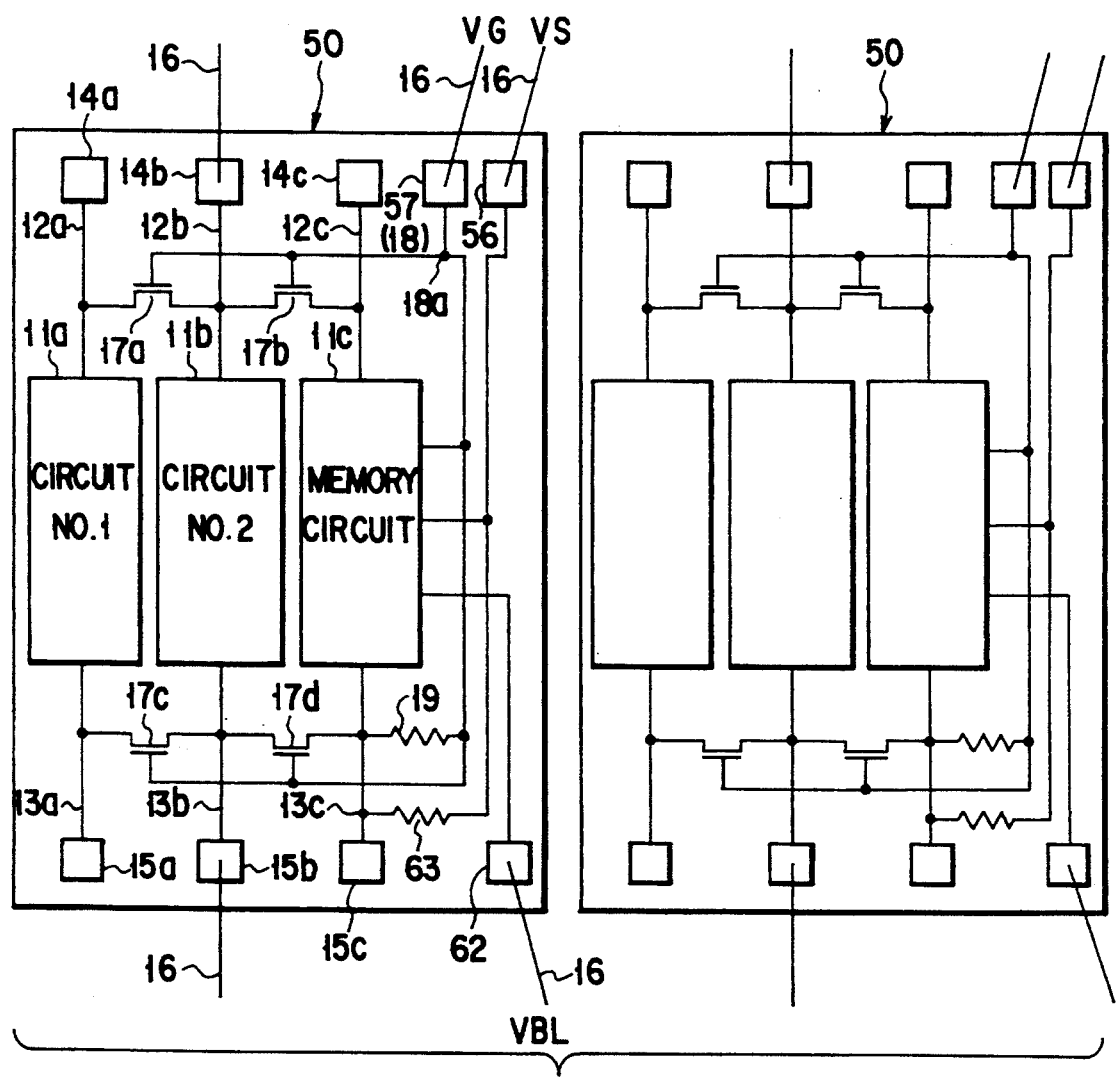
FIG. 7 is a plane view showing a state that needles of a prober card are brought into contact with a chip area and voltage stress is applied thereto when a semiconductor device according to a fifth embodiment of the present invention is burned-in in a wafer state.

FIG. 7 is a plane view showing a state that the needles of a probe card are brought into contact with chip areas and voltage stress is applied thereto when a semiconductor device relating to a fifth embodiment of the present invention is burned-in in a wafer state.

In FIG. 7, each chip area 50 is the same as each chip area 10 of FIG. 3 excepting that a memory circuit is provided in at least one of circuit 11a to 11c (11c in this embodiment), and word line voltage stress applying means is provided so as to simultaneously apply voltage stress to all word lines (or number of word lines, which is larger than that of word lines to be selected at the time of the normal use) of the memory cell array of the memory circuit by applying a voltage to the pad 18 for stress test.

In FIG. 7, reference numerals 56, 57, and 62 are pads for stress test, which a part of word line voltage stress applying means, and reference numeral 63 is a pulldown high resistor, which is connected the portion between the pad 56 for stress test and VSS line 13c.

Figure 8:
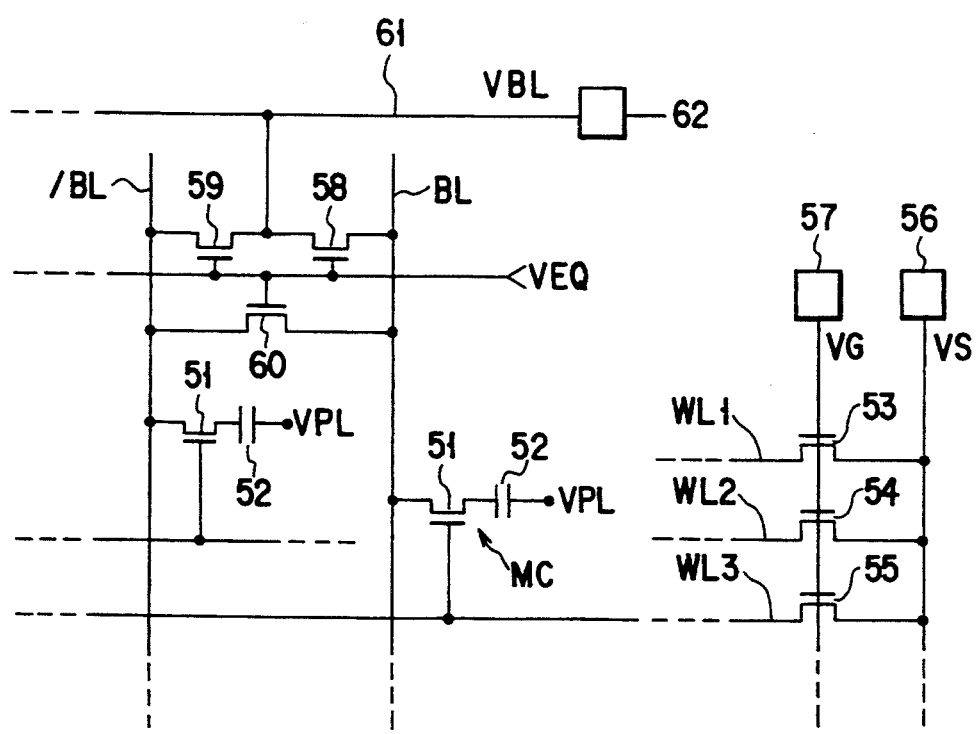
FIG. 8 is a circuit diagram showing a part of a DRAM circuit formed on the semiconductor chip area of FIG. 7.

FIG. 8 is one example of word line voltage stress applying means, and shows means for simultaneously applying voltage stress to the word lines of a DRAM circuit described in a semiconductor memory device of U.S. application Ser. No. 544,614 (Japanese Patent Application No. 1-169631).

In FIG. 8, MC denotes a dynamic type memory cell of one-transistor and one capacitor type. In this figure, one memory cell is typically shown, but a plurality of memory cells are arranged in a matrix manner, thereby a memory cell array is formed.

Reference numeral 51 is an NMOS transistor (cell transistor) for transfer gate of memory cell MC, 52: a capacitor of the memory cell MC, and VPL: capacitor plate potential.

WL1 to WL3 . . . are word lines of the memory cell array, and connected to each gate of the cell transistor 51 of the same row in common.

(BL,/BL) typically denote a pair of the bit lines of the memory cell array, and connected to each drain of the cell transistor 51 of the same column in common.

One end of each of MOS transistors 53, 54, 55 is connected to the end of each of the word lines WL1 to WL3. The other end of each of MOS transistors 53, 54, 55 is connected in common to the first pad 56 for stress test, which is not used at the time of normal operation. Each gate of MOS transistors 53, 54, and 55 is connected in common to the second pad 57 for the stress test.

Reference numerals 58 and 59 denote MOS transistors for bit line precharge, 60: MOS transistor for bit line equalization, VEQ: bit line precharge equalize signal; and 61: bit line precharge power line to which the third pad 62 is connected.

According to the structure of FIG. 8, when the screening of the defective chip area is performed, the needle 16 of the probe card of the tester is brought into contact with the pads 56, 57, and 62 for stress test provided in the memory circuit area, and voltage stress is applied to the word lines WL1 to WL3. Thereby, it is possible to perform the screening of the defective chip area in view of the wafer process of the cell transistor 51.

In this case, voltage stress may be applied in a state that all transistors are turned off without supplying power voltage to the memory circuit (that is, VCC=VSS=0V). However, since the respective bit lines BL,/BL are in a floating state, there is possibility that electrical field stress, which is generated between the gate and drain of cell transistor 51 by the potential difference between the word lines and bit lines, will be insufficient.

In consideration of the above possibility, the following operation may be added to obtain more effective result.

That is, power voltage VCC is supplied to the memory circuit, and set to be in a standby state that no data reading/writing operation is performed. Then, the bit line precharge signal generator (not shown) is activated, so that a precharge equalization signal VEQ is generated. The bit line precharge transistors 58 and 59 are turned on, and a predetermined bit line voltage VBL is supplied to the bit lines from the third pad 62.

By adding the above operation, a predetermined bit line voltage VBL can be simultaneously applied to all bit lines with substantially no correction of the conventional circuits provided around the bit lines.

Then, stress voltage VS is applied to the first pad 56, and gate control voltage VG having VS+Vth (where vth=threshold voltage of MOS transistors 53 to 55) is applied to the second pad 57. Thereby, the MOS transistors 53 to 55 are turned on, and the predetermined voltage stress is applied to all word lines WL1 to WL3.

Moreover, a predetermined bit line voltage VBL (e.g., VSS) is applied to the third pad 62, so that a predetermined voltage stress can be applied to the portion between the word lines and the bit lines, that is, a gate insulating film of the cell transistor 51.

In this case, the cell transistor 51 is in a state that a triode is operated, and a channel area is formed on the entire surface under the gate electrode, and voltage stress is directly applied to the entire surface of the gate insulating film.

Since the stress voltage VS and the gate control voltage VG generally are higher than the power voltage VCC, the stress voltage VS and the gate control voltage VG can be also used as an apply-voltage to the gate electrode of each of the transistors 17a to 17d of FIG. 7.

Therefore, the second pad 57 of FIG. 8 is used as the pad 18 for gate voltage application, so that the gate control voltage VG can be applied to the pad 18 for gate voltage application.

According to the structure of FIG. 7, the same operation as the semiconductor device of FIG. 3, and word line voltage stress applying means can be used for the following operations.

That is, at the time of voltage stress test, the needle 16 of the probe card is brought into contact with the VCC pad 14b so that the VCC potential is supplied thereto. The needle 16 of the probe card is brought into contact with the VSS pad 15b so that the VSS potential is supplied thereto. Then, the needle 16 of the probe card is brought into contact with the pad 57 (or 18) for gate voltage application so that the gate control voltage VG is applied thereto, and the transistors 17a to 17d of FIG. 7 and the transistors 53 to 55 of FIG. 8 are turned on.

Also, the needle 16 of the probe card is brought into contact with the pad 56 for stress test so that the stress voltage VS is applied thereto. Moreover, the needle 16 of the probe card is brought into contact with the pad 62 for stress test so that a predetermined bit line voltage VBL is applied thereto.

At the time of the diesort test, since the common connection node 18a is pulled down to the VSS potential by the resistor 19, the transistors 17a to 17d of FIG. 7 and the transistors 53 to 55 of FIG. 8 are turned off. At this time, since the pad 56 for stress test is pulled down to the VSS potential by the resistor 63, the source nodes of the transistors 53 to 55 of FIG. 8 are fixed to the VSS potential.

After containing the chip area in the package, since the common connection node 18a is pulled down to the VSS potential by the resistor 19, the transistors 17a to 17d of FIG. 7 and the transistors 53 to 55 of FIG. 8 can be turned off. At this time, since the pad 56 for stress test is pulled down to the VSS potential by the resistor 63, the source nodes of the transistors 53 to 55 of FIG. 8 can be fixed to the VSS potential.

In FIG. 7, in place of the pad 57 for the gate voltage application, the pad 56 for stress test is connected to the common connection node 18a, and the transistors 17a to 17d can be switch-controlled by the stress voltage VS.

According to the semiconductor device of FIG. 7, the same technical advantage as the semiconductor device of FIG. 3. In addition, the voltage stress pad 57 for applying the voltage stress to the word lines of the memory circuit can be used as the gate voltage applying pad 18 for switch-controlling the transistors for selectively shortcircuiting the plurality of VCC lines or VSS lines. Therefore, the number of pads may be small.

Regarding each of the semiconductor devices of FIGS. 4 to 6, the memory circuit and word line voltage stress applying means can be provided in the same way as the semiconductor device of FIG. 7.

In each of the above-explained embodiments, the structure of the pad for stress test is not limited to the bonding pad. If the pad is connectable to the contact needles (conductive rubber may be used in place of the needles) of the probe card of the tester used in burning-in in the wafer state, any pads may be used.

Moreover, the above embodiments explained the case in which the plurality of VCC lines and VSS lines, and the plurality of VCC pads and VSS pads are provided in the plurality of circuits. However, the present invention can be attained in the same way as the above-mentioned embodiments in a case that at least a plurality of VCC lines and VCC pads are provided in a plurality of circuits or a case that at least a plurality of VSS lines and VSS pads are provided in a plurality of circuits.

The present invention is not limited to the above explained embodiments. The present invention can be variously modified in the scope of the gist of the present invention and the claims.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising:
   a plurality of circuits formed on an IC chip area, having electric power systems each being independent;
   a plurality of power potential supply wires connected to the plurality of circuits, respectively;
   a plurality of power potential supply terminals connected to the plurality of power potential supply wires, respectively;
   at least one pad for voltage stress test formed on said IC chip area; and
   controllers for controlling a predetermined voltage stress to be applied from one of said plurality of power potential supply terminals to all power potential supply wires on the IC chip area by use of an input from said pad for voltage stress test.

2. The device according to claim 1, wherein said controller has a transistor for selectively shortcircuiting said plurality of power potential supply wires.

3. A semiconductor device comprising:
   a plurality of circuits formed on an IC chip area, having electric power systems each being independent;
   a plurality of ground potential supply wires connected to the plurality of circuits, respectively;
   a plurality of ground potential supply terminals connected to the plurality of ground potential supply wires, respectively;
   at least one pad for voltage stress test formed on said IC chip area; and
   controllers for controlling a predetermined voltage stress to be applied from one of said plurality of ground potential supply terminals to all ground potential supply wires on the IC chip area by use of an input from said pad for voltage stress test.

4. The device according to claim 3, wherein said controller has a transistor for selectively shortcircuiting said plurality of ground potential supply wires.

5. A semiconductor device comprising:
   a plurality of circuits formed on an IC chip area, having electric power systems each being independent;
   a plurality of power potential supply wires connected to the plurality of circuits, respectively;
   a plurality of power potential supply terminals connected to the plurality of power potential supply wires, respectively;
   a plurality of ground potential supply wires connected to the plurality of circuits, respectively;
   a plurality of ground potential supply terminals connected to the plurality of ground potential supply wires, respectively;
   at least one pad for voltage stress test formed on said IC chip area; and
   controllers for controlling a predetermined voltage stress to be applied from one of said plurality of power potential supply terminals to all power potential supply wires on the IC chip area by use of an input from said pad for voltage stress test, and for controlling a predetermined voltage stress to be applied from one of said plurality of ground potential supply terminals to all ground potential supply wires on the IC chip area by use of the input from said pad for voltage stress test.

6. The device according to claim 5, wherein said controller has a transistor for selectively shortcircuiting said plurality of power potential supply wires and a transistor for selectively shortcircuiting said plurality of ground potential supply wires.

7. The device according to one of any claims 1 to 6, wherein at least one of said plurality of circuits is the memory circuit, the memory circuit has a memory cell array on which memory cells are arranged in a matrix form, word lines connected in common to the memory cell on the same row of the memory cell array, bit lines connected in common to the memory cell on the same column of the memory cell array, and means are formed to apply a voltage stress to all word lines of the memory cell of said memory circuit or larger number of word lines than the word lines selected in normal use by applying the voltage to the pad for voltage stress test.

8. The device according to claim 7, wherein said memory circuit is a dynamic type memory circuit having an array of a dynamic type memory cell.

9. The device according to one of any claims 1 to 6, wherein said IC chip area is one of a plurality of chip areas formed on a semiconductor wafer.

10. The device according to one of any claims 1 to 6, wherein said IC chip area is contained in a package, and finished as an IC circuit device.

* * * * *